United States Patent [19]
Liang

[11] Patent Number: 5,888,897
[45] Date of Patent: Mar. 30, 1999

[54] PROCESS FOR FORMING AN INTEGRATED STRUCTURE COMPRISING A SELF-ALIGNED VIA/CONTACT AND INTERCONNECT

[75] Inventor: Chunlin Liang, San Jose, Calif.

[73] Assignee: Intel Corporation, Santa Clara, Calif.

[21] Appl. No.: 739,879

[22] Filed: Oct. 31, 1996

[51] Int. Cl.$^6$ .................................................. H01L 21/44
[52] U.S. Cl. ........................... 438/622; 438/624; 438/976
[58] Field of Search .................................. 438/622, 639, 438/696, 723, 700, 787, 976, 624

[56] References Cited

U.S. PATENT DOCUMENTS

| | | | |
|---|---|---|---|
| 4,883,767 | 11/1989 | Gray et al. | 437/41 |
| 5,063,169 | 11/1991 | De Bruin et al. | 437/41 |
| 5,158,910 | 10/1992 | Cooper et al. | 437/195 |
| 5,187,121 | 2/1993 | Cote et al. | 437/195 |
| 5,219,787 | 6/1993 | Carey et al. . | |
| 5,270,236 | 12/1993 | Rösner | 437/48 |
| 5,286,674 | 2/1994 | Roth et al. . | |
| 5,319,247 | 6/1994 | Matsuura | 257/760 |
| 5,352,630 | 10/1994 | Kim et al. | 437/195 |
| 5,382,545 | 1/1995 | Hong | 437/195 |
| 5,461,004 | 10/1995 | Kim . | |
| 5,714,039 | 2/1998 | Beilstein, Jr. et al. . | |

OTHER PUBLICATIONS

*IBM Technical Disclosure Bulletin*, "Method for Forming Via Hole Formation" vol. 34, 10A, Mar. 1992, pp. 219–220.
*IBM Technical Disclosure Bulletin*, "Self–Aligned, Borderless Polysilicon Contacts Using Polysilicon Pillars", vol. 35, No. 2, Jul. 1992, pp. 480–483.
T. Fukase,et al., "A Margin–Free Contact Process Using An Al$_2$O$_3$ Etch–Stop Layer For High Density Devices", *IEEE*, Apr. 1992, pp. 33.3.1–33.3.4.
Masakazu Kakumu, et al., "(PASPAC with Low Contact Resistance and High Reliability in CMOS LSI's", 1987 Symposium on VLSI Technology, *IEEE*, May 18–21, 1987, pp. 77–78.
D. Kenney, et al., "A Buried–Plate Trench Cell for a 64–Mb DRAM", 1987 Symposium on VLSI Technology,*IEEE,* May 18–21, 1987, pp. 14–15.
K.H. Küsters et al., "A Stacked Capacitor Cell with a Fully Self–Aligned Contact Process for High–Density Dynamic Random Access Memories", J. Electrochem. Soc.,Aug. 1992, pp. 2318–2321.
K.H. Küsters, "A High Density 4Mbit dRAM Process Using a Fully Overlapping Bitline Contact (FoBIC) Trench Cell", pp. 93–94.
E. Magdo and S.D. Malaviya, *IBM Technical Disclosure Bulletin,* "Self–Aligned Metal Bipolar Process", vol. 24, No. 10 Mar. 1982, pp. 5128–5131.
S. Subbanna, et al., "A Novel Borderless Contact/Interconnect Technology Using Aluminum Oxide Etch Stop for High Performance SRAM and Logic", *IEEE,* 1993, pp. 17.3.1–17.3.4.
K. Ueno, et al., "A Quarter–Micron Planarized Interconnection Technology With Self–Aligned Plug", *IEEE,* Apr., 1992, pp. 11.6.1–11.6.4.
Stanley Wolf, PhD. et al., vol. I–, "Process Technology", *Silicon Processing for the VLSI Era,* 1986, pp. 453–454.
Stanley Wolf, PhD., vol. II, "Process Integration", *Silicon Processing for the VLSI Era,*Apr. 22, 1992, pp. 222–237.

Primary Examiner—Caridad Everhart
Attorney, Agent, or Firm—Blakely, Sokoloff, Taylor & Zafman LLP

[57] ABSTRACT

A method of forming an integrated structure that comprises a self-aligned via/contact and metal line is described. The via/contact is formed out of part of a first spacer made of a first dielectric and surrounded by a second dielectric in a first sandwich structure. The metal line is formed out of a second spacer made of the first dielectric and surrounded by the second dielectric in a second sandwich structure. The second sandwich structure is disposed over the first sandwich structure. At the point of contact between the first and second spacer, an angle of 90° exists in a preferred embodiment. The via/contact and metal line form a self-aligned integrated structure that is created in one etch step. The integrated structure is subsequently filled with a conductive material.

40 Claims, 9 Drawing Sheets

PROCESS FOR FORMING AN INTEGRATED STRUCTURE COMPRISING A SELF-ALIGNED VIA/CONTACT AND INTERCONNECT

BACKGROUND OF THE INVENTION

1. Field of the Invention

The present invention relates generally to semiconductor manufacturing. In particular, the invention relates to a method for forming an integrated self-aligned via/contact and interconnect.

2. Description of Related Art

During the process of semiconductor fabrication, alternating layers of a nonconducting material (dielectric), such as silicon dioxide, and of a conductor, such as aluminum tungsten, are formed over the semiconductor substrate. Devices, such as transistors or diodes, among others, are formed at and within the semiconductor substrate. Contact between the lowest layer of conductive material and a region of a device, at and within the semiconductor device (e.g., a source or drain) is made through an opening in a first dielectric layer. The opening is then filled with a conductive material to form a contact that couples the region of the device to the lowest conductive layer. In addition, a vertical opening, known as a via, is filled with conductive material to connect circuits on various layers of a device to one another and to the semiconductor substrate. This conductive material is known as an interconnect.

Openings (i.e., vias and contacts) are often formed using a mask and photolithography. For example, a photosensitive film, such as photoresist, is applied to a surface of the semiconductor substrate. A mask with a desired pattern is used during photolithography to help transfer the desired pattern onto the substrate or a surface on the substrate. The photoresist is then exposed to light through the mask and then developed. The exposed surface of the substrate and photoresist are removed so that the desired pattern is now on the substrate's surface.

Referring to FIG. 1A, a first mask (not shown) patterns an opening in dielectric 103 to form the opening for contact 102 shown in FIG. 1B. A conductive layer is then formed over dielectric 103. Any excess conductive material is removed. The result is shown in FIG. 1B, a contact 102, made of the conductive material, is formed in dielectric 103 on a semiconductor substrate 100. Another conductive layer 105 and then a photosensitive layer are deposited. The photosensitive layer 107 is then patterned to form a metal line as illustrated in FIG. 1C. During the process of etching the conductive layer 105 forms the metal line 106 and an overetch of contact 102 occurs. Consequently, part of contact 102 is etched away as shown in FIG. 1D. This causes reliability problems and possibly circuit failure. The smaller contact area also increases contact resistance and degrades circuit performance. In order to avoid this problem, which is usually caused by forming the contact opening and metal line in two steps, extra chip space is used for overlay alignment errors. Thus, photoresist layer would be extended as shown by the dotted lines 109 to cover contact 102 with some extra space in case of overetching. In turn, the metal line is then etched at dotted lines 111 to prevent overetching of contact 102. Thus, extra chip space must be reserved for overlay alignment errors that could have been used for additional devices. This results in decreased chip density.

Because the size of the contact 102 opening and the overlaying interconnect opening are so small (e.g., 0.18–0.2 micron), it is very difficult to align the two openings accurately using the current photolithography tool set. For example, if contact 102 had a horizontal width of 0.1 micron, a space of about 0.025 micron (in the best case) must be saved on the chip around each side of contact 102, and on mask 104, which patterns the subsequent metal line. This extra space (109, 111) around contact 102 allows room for overlay alignment errors between the contact 102 and the metal line 106. Thus, even assuming a best case scenario, the space around contact 102 increased by 50%, since 0.025× 2=0.05. This reduces the chip density and results in a larger chip size. Because the semiconductor industry wants increased chip density (e.,g., 100 million or more components on a chip), this is an undesirable effect.

The current lithography tool set is unable to form a via/contact with a subsequently formed interconnect when the via/contact or interconnect has a horizontal width of 0.1 micron or less. E-beam exposure systems and X-Ray systems are two other options for forming openings with a width of 0.1 micron or less. Unfortunately, E-beam and X-ray systems are not feasible for manufacturing use and are still in the research stage. In addition, the cost of using the E-beam and X-ray systems is prohibitive. Thus, what is needed is a manufacturable method for forming very small openings (e.g., sub-0.1 micron) that is not dependent on the current lithography tool set. Furthermore, what is needed is a method that forms an integrated structure that comprises a self-aligned via/contact and interconnect. Because the via/contact and interconnect are self-aligned, no chip space is lost due to overlay alignment errors.

SUMMARY

A method of forming an integrated structure comprising the following steps is described. A first sandwich structure having a first spacer of a first dielectric is formed. The first spacer is surrounded by a first insulating layer. A second sandwich structure having a second spacer of the first dielectric is formed. The second spacer is surrounded by a second insulating layer. The second sandwich structure is disposed above the first sandwich structure. The second spacer and a portion of the first spacer that is disposed below the second spacer are removed to form an opening. A conductive layer is formed in the opening to create the integrated structure.

BRIEF DESCRIPTION OF THE DRAWINGS

The present invention is illustrated by way of example and not by limitation in the figures of the accompanying drawings in which like references indicate similar elements.

FIG. 2F-2 illustrates a top view of FIG. 2F-1.

FIG. 2L-1 illustrates a front view after the sixth layer has been planarized.

FIG. 2L-2 illustrates a side view of FIG. 2L-1.

FIG. 2M-1 illustrates a top view after the two spacers formed from the fifth insulating layer are removed and part of each of the two spacers formed from the second insulating layer are removed.

FIG. 2M-2 illustrates a cut-away side view through one of the lower spacers of FIG. 2M-1.

FIG. 2M-3 is a simplified-side-perspective view of only one of the two openings created by an anisotropic etch.

FIG. 3A-1 illustrates a front-perspective view of a mask over the areas that will not be etched.

FIG. 3A-2 is a side view of FIG. 3A-1.

FIG. 3D-1 illustrates a side view after the sixth layer has been planarized.

FIG. 3D-2 illustrates a top view of FIG. 3D-1.

FIG. 3E-1 is a top view of an opening after an anisotropic etch of the remaining spacer of the second set and part of a spacer of the first set.

FIG. 3E-2 is a side-perspective view of the opening shown in FIG. 3E-1.

DETAILED DESCRIPTION

A method of forming an integrated structure comprising a self-aligned via/contact and interconnect is described. In the following description, numerous specific details are given to provide a thorough understanding of the invention. But it will be apparent to one skilled in the art that the invention may be practiced without these specific details. Moreover, in some instances, well-known semiconductor equipment and processes have not been set forth in detail in order not to unnecessarily hide the present invention.

The present invention is a method of forming an integrated structure that comprises the following steps. A first sandwich structure having a first spacer of a first dielectric is formed over a substrate. The first spacer is surrounded by a first insulating layer, which is also part of the first sandwich structure. A second sandwich structure having a second spacer of the first dielectric is formed. The second spacer is surrounded by a second insulating layer, which is also part of the second sandwich structure. The second sandwich structure is disposed above the first sandwich structure. The second spacer and a portion of the first spacer that is disposed below the second spacer are removed to form an opening. A conductive layer is formed in the opening to create the integrated structure, which comprises a self-aligned contact and interconnect.

The inventive method offers several advantages over the prior art. First, the method is capable of creating very small openings or holes (e.g., sub-0.1 micron to 0.1 micron) without depending on the current lithography tool set, which is unable to form such small openings. Second, the method forms a self-aligned integrated structure that comprises a via/contact and interconnect without losing any chip space to overlay alignment errors. The self-alignment feature ensures that no chip space is lost to overlay alignment errors. Consequently, there is no decrease in chip density. Thus, this method provides the advantage of meeting industry demand for increased chip density without depending on lithography and cost-prohibitive tools, such as the E-beam exposure system.

Figure 2A:
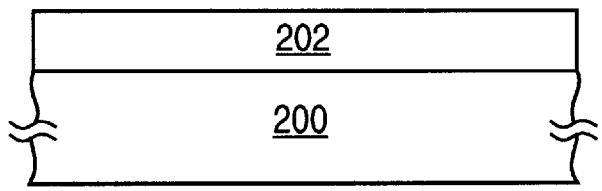
FIG. 2A illustrates an insulating layer disposed over a substrate.
Figure 2B:
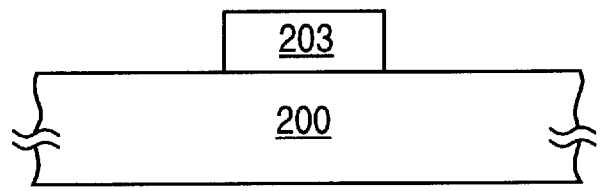
FIG. 2B illustrates the insulating layer after it has been etched to form a first structure.
Figure 2C:
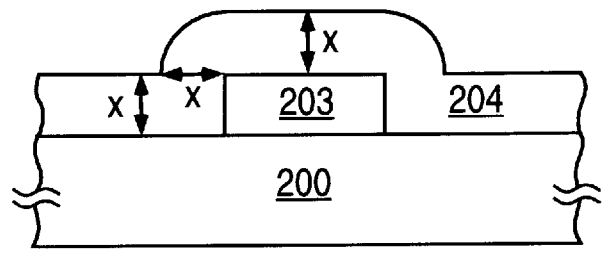
FIG. 2C illustrates a conformal deposition of a second insulating layer over the first structure.
Figure 2D:
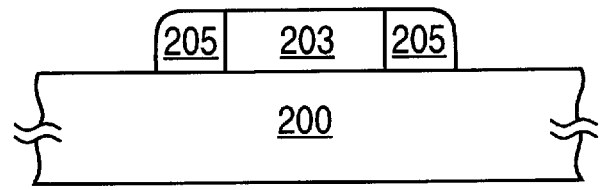
FIG. 2D illustrates the formation of a first set of spacers after the second insulating layer is anisotropically etched.
Figure 2E:
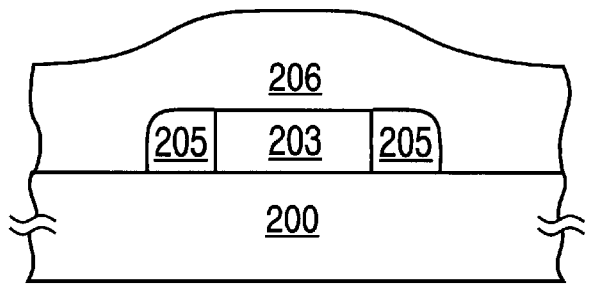
FIG. 2E illustrates a conformal deposition of a third layer over the two spacers and the first structure.
Figures 1, 2F:
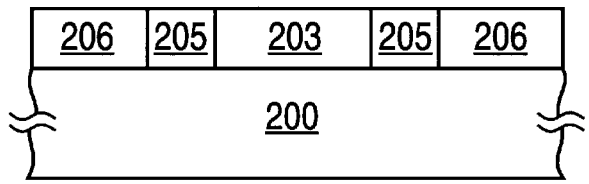
FIG. 2F-1 is a front view of FIG. 2E after planarizing the third layer.
Figures 2, 2F:
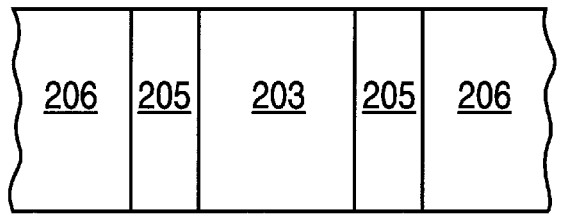
Figure 2G:
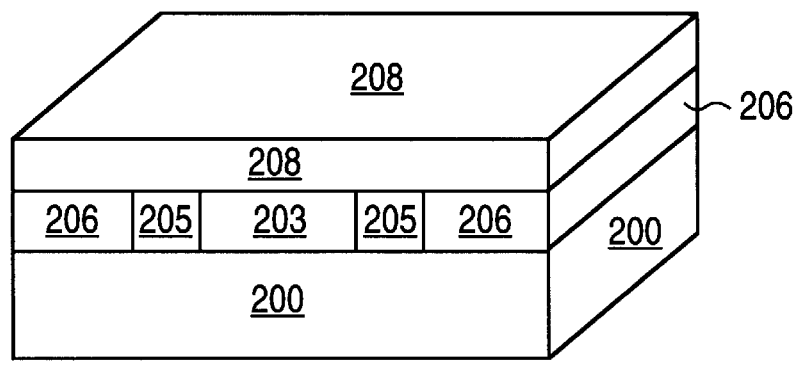
FIG. 2G illustrates a perspective view of FIG. 2F after a deposition of a fourth layer.
Figure 2H:
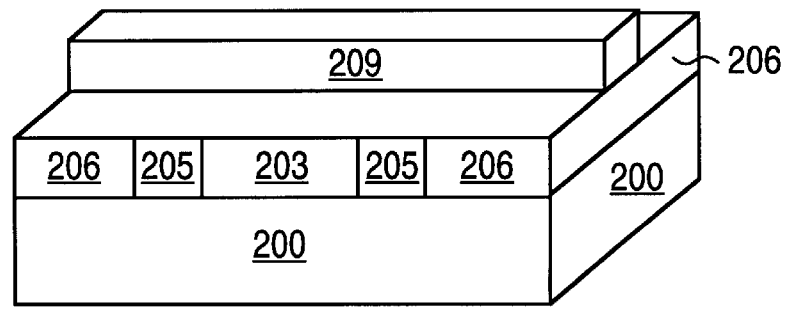
FIG. 2H illustrates a perspective view of the structure after the fourth layer has been etched to form a second structure.
Figure 2I:
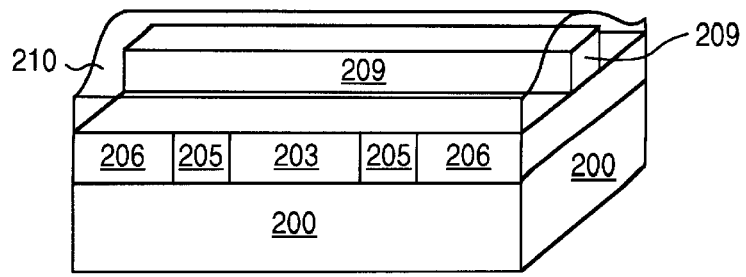
FIG. 2I illustrates a conformal deposition of a fifth insulating layer.
Figure 2J:
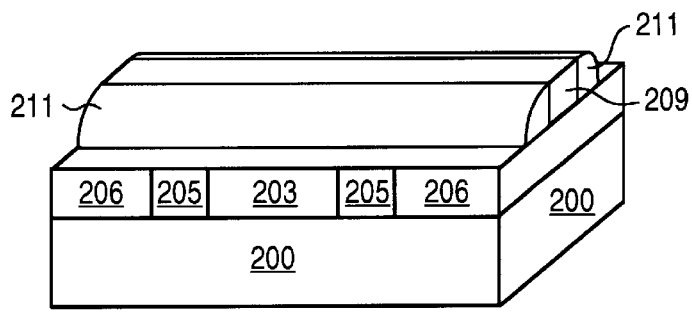
FIG. 2J illustrates a front-perspective view of the structure of FIG. 2I after the fifth insulating layer has been anisotropically etched to form a second set of spacers.
Figure 2K:
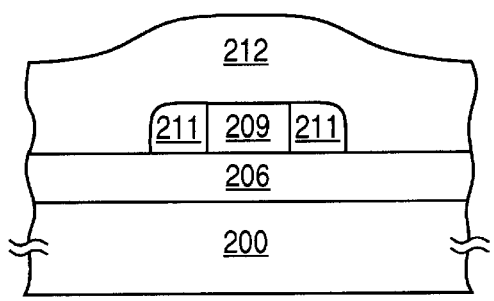
FIG. 2K illustrates a deposition of a sixth layer over the second set of two spacers and the second structure.
Figures 1, 2L:
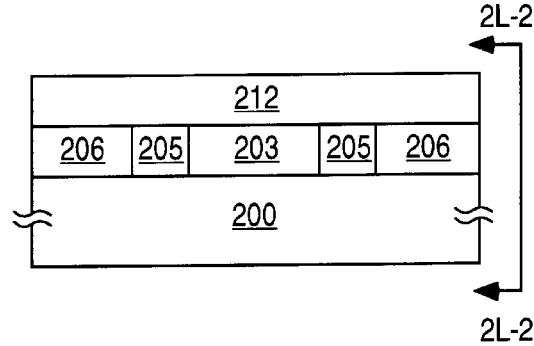
Figures 2, 2L:
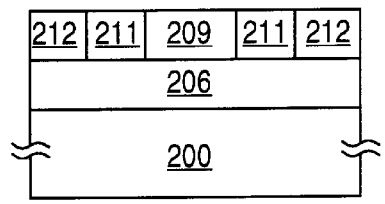
Figures 1, 2M:
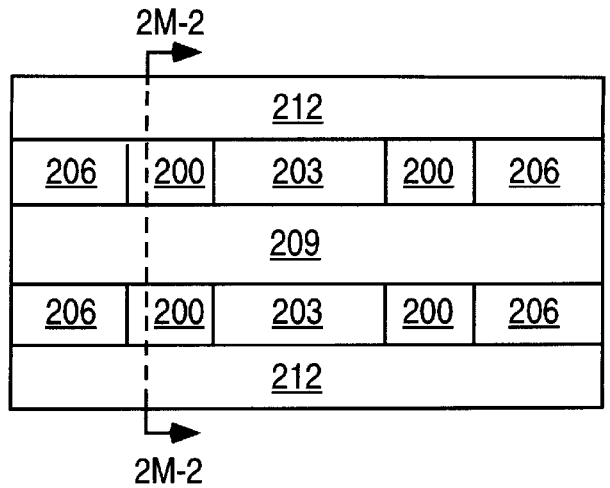
Figures 2, 2M:
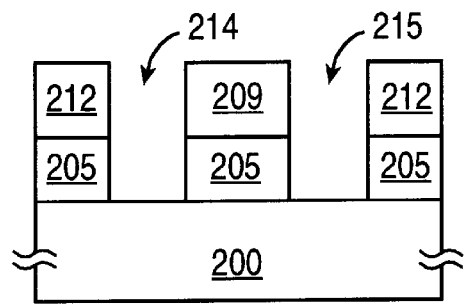
Figures 2, 2M, 3:
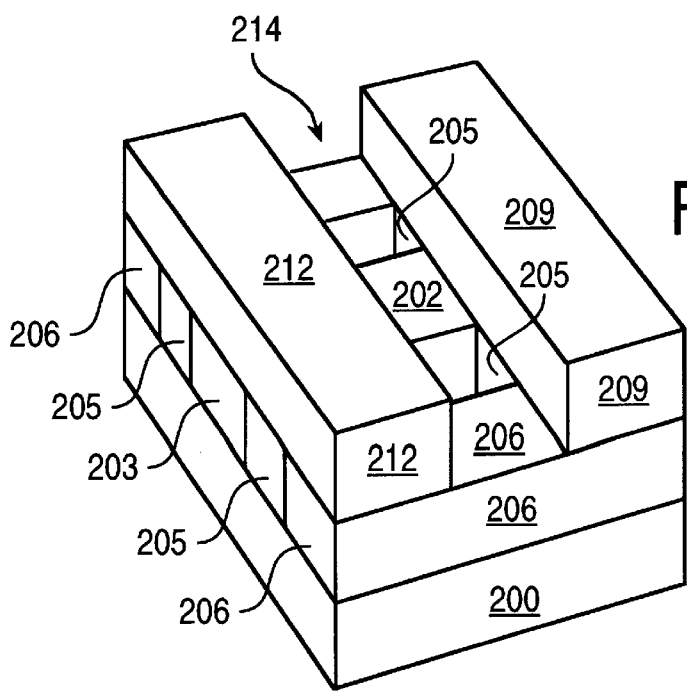
Figure 2N:
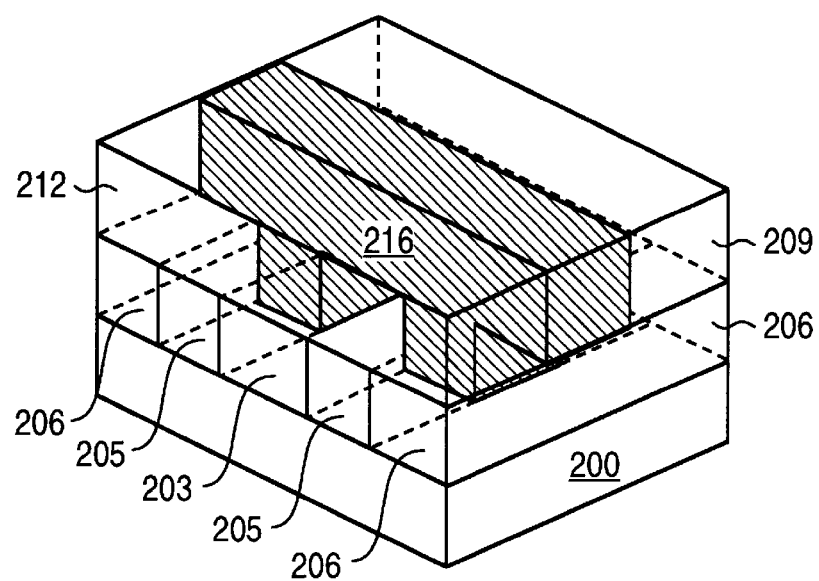
FIG. 2N is a simplified-side-perspective view of one of the openings filled in with a conductive layer to form an integrated structure that comprises a via/contact and a metal line (interconnect) structure.

FIGS. 2A–2N illustrate one embodiment of the method of the present invention. Referring to FIG. 2A, forming a first insulating layer 202 over a substrate 200 is illustrated. A substrate 200 is provided, that typically contains active and passive semiconductor devices, at and within the substrate 200. The substrate 200 may also be one of the layers in a multilevel interconnect. First insulating layer 202 is used to isolate substrate 200 from a subsequently formed layer. In one embodiment, the first insulating layer 202 is silicon dioxide. It is to be appreciated that another dielectric may also be used to form first insulating layer 202. The first insulating layer 202 can be deposited using standard chemical vapor deposition (CVD) methods or other applicable techniques. The circuit design determines the thickness of the first insulating layer 202 that is deposited since first insulating layer 202 remains as an interlayer dielectric (ILD). The thickness of first insulating layer 202 also affects the height of the spacers 205 that are later formed in FIG. 2D.

Next, as shown in FIG. 2B, the first insulating layer 202 is etched to form a first structure 203. Standard photolithography using a mask can be used to pattern the first insulating layer 202 to create the first structure 203. Although only two edges of first structure 203 are illustrated, first structure 203 may have more edges. For example, if first structure 203 is shaped like a rectangle, then it would have four edges along which a spacer could be formed. In addition, a plurality of structures similar to first structure 203 may be formed all along substrate 200, although for the sake of clarity, only first structure 203 is shown. The location of first structure 203 is determined by the desired location of the subsequently formed spacers 205, since the two opposing edges of first structure 203 will form the inner edge of each of the spacers 205 shown in FIG. 2D.

Referring to FIG. 2C, a second insulating layer 204 is conformally deposited over the first structure 203 and the substrate 200. Second insulating layer 204 is silicon nitride in a preferred embodiment. The second insulating layer 204 can be deposited using standard chemical vapor deposition (CVD) techniques to achieve a conformal deposition. It is to be appreciated that other applicable methods and other dielectrics may be used to form second insulating layer 204.

The thickness of the second insulating layer 204 is determined by the minimum dimension or width of the via/contact that is later formed out of the spacers 205 shown in FIG. 2D. For instance, if the desired width of the via/contact is 0.1 micron then a minimum thickness of about 0.1 micron of the second insulating layer 204 is conformally deposited. This is because the spacers 205 are formed from second insulating layer 204 and then are later removed to form the via/contact openings shown in FIG. 2M.

The dielectrics chosen for the first insulating layer 202 and the second insulating layer 204 can be selectively etched. In other words, a selective etch of second insulating layer 204 without etching first insulating layer 202 is desired. Compatible dielectric layers and dielectrics that do not have a high dielectric constant are desired. In a preferred embodiment, silicon dioxide was chosen for the first insulating layer 202 and silicon nitride was chosen for the second insulating layer 204 because of the low dielectric constant of silicon dioxide and because a selective etch of silicon nitride may be obtained. Other possible combinations may use two different insulating dielectrics, such as aluminum nitride and boron nitride that provide etching selectivity between two different dielectrics.

Next, FIG. 2D illustrates a front view after the second insulating layer 204 has been anisotropically etched to form two spacers 205 on either side of the first structure 203. In addition, second insulating layer 204 has also been etched until a top surface of first structure 203 is revealed. The height of the spacers 205 is about the same as the height of the first structure 203. In a preferred embodiment, the anisotropic etch uses standard dry etch techniques. It is to be appreciated that other applicable removal methods may be used. A portion of each of the two spacers 205 will be removed later to form an opening for a via/contact from each spacer 205. It is to be appreciated that more than two spacers may be formed, depending on the shape of first structure 203. For example, if first structure 203 is shaped like a square, then four spacers may be formed so that one spacer per edge is formed. In addition, the circuit may be designed so that none of or less than all four spacers are coupled to the subsequently formed spacers that are located above them. This is important because every place where one spacer (e.g., 211 of FIG. 2J) crosses over another spacer (e.g., 205), a potential self-aligned via/contact and metal line are formed. Thus, to avoid crossovers where a via/contact or metal line should not be located, spacers 205 may be designed to crossover subsequently formed spacers 211 (of FIG. 2J) only where it is desirable. At times, however, an unwanted crossover is unavoidable, and in those cases, an additional mask may be used, as shown in FIGS. 3A–F, to remove the metal line formed from the crossover.

Then a third layer 206 is conformally formed as illustrated in FIG. 2E. Third layer 206 can be deposited using standard chemical vapor deposition (CVD) techniques or any other applicable method to achieve a conformal deposition. In a preferred embodiment, third layer 206 is the same material as first layer 202, which is usually silicon dioxide. Next, third layer 206 can be chemical-mechanically polished to the desired interlayer dielectric thickness resulting in the sandwich structure shown in FIG. 2F-1. Third layer 206 is polished until a planar layer is formed. The top surfaces of both first structure 203 and spacers 205 are revealed. It is to be appreciated that third insulating layer 206 may also be planarized using other methods.

FIG. 2F-1 is a front view of the first sandwich structure that is formed and that comprises first structure 203, spacers 205 and third layer 206. The two spacers 205 are each sandwiched on one side by first structure 203, and on the other side by third layer 206. Part of spacers 205 may be later removed and filled with a conductive material to form part of the integrated structure 216 shown in FIG. 2N. Possible conductors are tungsten, aluminum, titanium, gold, copper and their respective alloys. A top view of FIG. 2F-1 is illustrated in FIG. 2F-2.

Next, after a fourth layer 208 is formed over the first sandwich structure of FIG. 2F, a front-perspective view is shown in FIG. 2G. In one embodiment, the fourth layer 208 is preferably the same material as first structure 203, which is usually silicon dioxide. Other materials may also be used to form fourth layer 208 as long as it allows a selective etch of spacers 205 and the subsequently formed spacers 211 shown in FIG. 2J. The fourth layer 208 can be deposited using standard chemical vapor deposition (CVD) methods or other applicable techniques. The circuit design determines the thickness of the fourth layer 208 that is deposited since fourth insulating layer remains as an intermetal dielectric. The thickness of fourth layer 208 also affects the height of the spacers 211 that are later formed in FIG. 2J.

The fourth layer 208 is then etched to form a second structure 209 as illustrated in FIG. 2H. It is to be appreciated that a plurality of structures similar to second structure 209 may be formed, although for the sake of clarity, only second structure 209 is shown. The location of second structure 209 is determined by circuit design as each of the opposing edges of second structure 209 form an inner edge of the subsequently formed spacers 211 of FIG. 2J. It is to be appreciated that the number of spacers later formed depends on the shape of second structure 209. This is because one spacer may be formed along each perimeter edge of second structure 209. For example, if second structure 209 is a triangle, then three spacers can be formed along its three perimeter edges.

Conventional dry etch techniques can be used to etch fourth layer 208 to form second structure 209. In addition, part of the top surface of first structure 203, of spacers 205 and of third layer 206 are exposed. Moreover, a portion of the lower surface of second structure 209 contacts a portion of a top surface of first structure 203 at an angle in one embodiment. It is to be noted, however, that first structure 203 and second structure 209 may also be aligned at an angle of 90° or less at point of contact or crossover.

In FIG. 2I, a fifth insulating layer 210 is conformally deposited over second structure 209, first structure 203, two spacers 205 and third insulating layer 206. The fifth layer 210 can be deposited using standard chemical vapor deposition (CVD) techniques to achieve a conformal deposition. It is to be appreciated that other applicable methods and other dielectrics may be used to form fifth insulating layer 210. The thickness of fifth insulating layer 210 is determined by the minimum dimension or width of the interconnect that is later formed out of each of the spacers 211 shown in FIG. 2J. For instance, if the desired width of the interconnect is 0.1 micron, then a minimum thickness of about 0.1 micron of the fifth insulating layer 210 is conformally deposited. This is because the spacers 211 are formed from fifth insulating layer 210 and then are later removed to form the metal line structures (interconnect openings) shown in FIG. 2M.

Next, using conventional dry etch methods, fifth insulating layer 210 is anisotropically etched to form two spacers 211, one on either side of second structure 209 as illustrated in FIG. 2J. In addition, part of the top surface of first structure 203, of spacers 205 and of third insulating layer 206 are exposed. A top surface of second structure 209 is also revealed. It is to be appreciated that more than two spacers may be formed out of fifth insulating layer 210 depending on the shape of second structure 209. This is because the shape of second structure 209 affects the number and location of the inner edges of spacers 211. Although the two spacers 211 contact (crossover) each of the other two spacers 205 in the first sandwich structure at four points as shown in FIG. 2J, it is to be appreciated that the two spacers 211 may be arranged to contact none or only one of the spacers 205. One of the spacers 211 may be removed to prevent formation of an integrated structure out of that spacer 211 and the spacer 205 disposed below it as shown in FIGS. 3A–F. It will be apparent to one skilled in the art that via/contact and a metal line may be formed at every point of contact (crossover) between a spacer 211 and spacer 205. As a result, if the circuit design is unable to prevent a crossover, then the resulting metal line may be removed as shown in FIGS. 3A–F. In addition, the formation of the undesired via/contact is also prevented as illustrated in FIGS. 3A–F.

At the point of contact between both sets of spacers (205, 211), an angle may be formed between the top (or second set of) spacers 211 and the lower (or first set of) spacers 205. In one embodiment, the angle ranges from 30° to 90°. It is also to be appreciated that other arrangements between the first set of spacers 205 to the second set of spacers 211 are possible. For example, the circuit design may dictate that contact be made between only one of second set of spacers 211 and one of first set of spacers 205. It will also be apparent to one skilled in the art that the spacers (205 and 211) may be nonlinear.

FIG. 2K illustrates a side view after a sixth layer 212 is formed over the second structure 209 and the second set of spacers 211. The sixth layer 212 can be conformally deposited using standard chemical vapor deposition (CVD) techniques or any other applicable method. Sixth layer 212 is preferably made of the same material as second structure 209. In a preferred embodiment, the sixth insulating layer 212 and the second structure 209 are made of silicon dioxide, and the second set of spacers 211 are made of silicon nitride. Furthermore, in the preferred embodiment, the first set of two spacers 205 are also made of silicon nitride and an angle exists at the point of contact between the first set of spacers 205 and the second set of spacers 211. It is to be appreciated that the angle that exists at the point of contact between the two sets of spacers (205, 211) may be 90° or less. It is to be appreciated that one of the spacers 211 may also be masked to prevent coupling to a subsequent layer and to prevent etching of that spacer 211 and the portion of spacer 205 directly below spacer 211 as shown in FIGS. 3A–F.

Next, a front view of the substrate after the sixth layer 212 has been planarized is shown in FIG. 2L-1. The top surface of second structure 209 and of spacers 211 are exposed and level with the top surface of sixth layer 212.

In one embodiment, the sixth layer 212 is preferably chemical-mechanically polished, however, other planarization techniques may also be used. A side-view taken from FIG. 2L-1 is illustrated in FIG. 2L-2. A second sandwich structure is formed that comprises second structure 209, second set of spacers 211, and the sixth layer 212. In other words, each one of spacers 211 is sandwiched between second structure 209 on one side, and sixth layer 212 on the other side to create a planar layer with several interwoven layers. Each of second set of spacers 211 is later removed and the opening created is filled with a conductive layer to form an interconnect, which is part of the integrated structure 216 shown in FIG. 2N.

Referring to FIG. 2M-1, a top view is shown after a selective anisotropic etch of the second set of spacers 211 and a portion of the first set of spacers 205 that is directly below the points of contact between spacer 211 and spacer 205. In other words, not all of spacer 205 is removed, only the portion that was directly aligned between substrate 200 and spacer 211. The anisotropic etch uses conventional dry etch techniques or other applicable methods. In the preferred embodiment, the spacers (205, 211) are silicon nitride and surrounded by silicon dioxide. In that embodiment, 40 sccm (standard cubic centimeters) of fluoromethyl ($CH_3F$) gas and 80 sccm of oxygen ($O_2$) gas provides a selective etch between silicon nitride and silicon dioxide.

The result of the selective etch is two openings (214, 215 that are shown in FIG. 2M-2). Each opening (214, 215) (may be known as a damascene structure) will become an integrated structure after metallization of their respective via/contact holes and metal line structures. Each opening (214, 215) has two via/contact holes and a metal line structure. It is to be appreciated that openings 214 and 215 are illustrative and not limiting. Four via/contact openings formed by etching part of spacer 205 and all of spacer 211 are revealed by the four squares of substrate 200 that are now visible from a top view. In addition, the removal of the second set of spacers 211 reveals two slices of the first sandwich structure because a surface of first structure 203 and third insulating layer 206 are visible from the top view of FIG. 2M-1.

Because the via/contact and metal line (interconnect) structure are formed in one etch step, no alignment is necessary to connect the interconnect to the via/contact. Since no alignment is needed, no chip space is lost due to overlay alignment errors. Thus, this self-aligned method results in greater chip density, which meets the semiconductor industry's demand for increased chip density.

A mid-section side view taken from the view of the arrows in FIG. 2M-1 is shown in FIG. 2M-2. For the sake of clarity, a portion of first structure 203 was not shown in the two openings (214, 215) that became visible from the selective etch. Because a different dielectric surrounds the spacers than the dielectric that forms the spacers (205, 211), and because the two dielectrics are chosen for their selectivity, a selective etch of the spacers (205, 211) is possible. A portion of the first set of spacers 205 and all of the second set of spacers 211 was removed as seen by the openings 214, 215, which may also be known as damascene structures.

In a preferred embodiment, both sets of spacers (205, 211) are made of silicon nitride and are both surrounded by silicon dioxide in their respective sandwich structure. For example, both of the second set of spacers 211 are surrounded on one side by second structure 209, which is made of silicon dioxide, and on the other side by sixth layer 212, which is also made of silicon dioxide. It is to be appreciated that the silicon nitride layers and silicon dioxide layers may be exchanged and that other materials may be used if they permit a selective etch. For instance, both sets of spacers (205, 211) may be made of silicon dioxide and surrounded on both sides by silicon nitride. This combination works because a selective etch of the spacer (205, 211) material may still be achieved. Thus, a combination of dielectrics or nondielectric-insulating materials that allows a single selective etch of one dielectric or nondielectric-insulating material may be used to form the openings (214, 215). The integrated structure (shown as 216 in FIG. 2N) is formed after metallization of the opening 214. The integrated structure includes a via/contact formed out of a portion of first spacer 205 and a metal line structure formed out of second spacer 211.

Figure 1A:
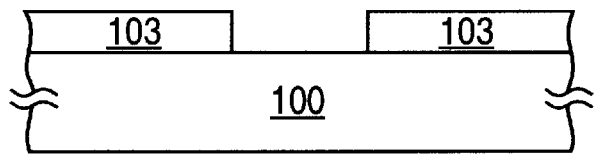
FIG. 1A illustrates formation of an opening in a substrate.
Figure 1B:
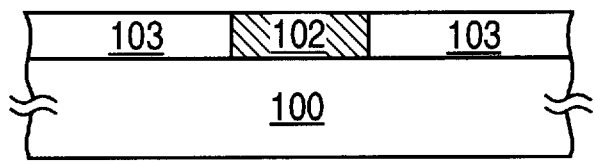
FIG. 1B illustrates formation of a contact.
Figure 1C:
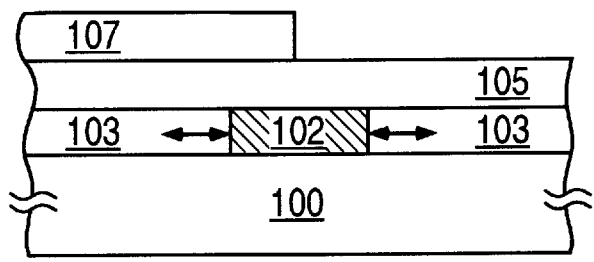
FIG. 1C illustrates patterning of a photosensitive film to form an interconnect.
Figure 1D:
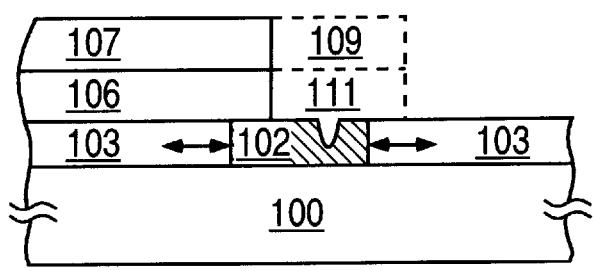
FIG. 1D illustrates how the prior art formation of an interconnect (metal line) required that some chip space must be reserved for overlay alignment errors.

FIG. 2M-3 illustrates a simplified-perspective view as one of the two openings 215 and the outer edge of that opening 215 are not shown. The "balance-beam shaped" opening 214, created by the selective anisotropic etch of the spacers 211 and part of the spacers 205, is more clearly seen in this perspective view. The method of the present invention is capable of forming a via/contact and interconnect with sub-lithographic dimensions, such as a width of sub-0.1 micron to 0.1 micron. A self-aligned via/contact and metal line structure (or interconnect) form the integrated structure (216 in FIG. 2N) that results from this inventive method. The present method does not rely on standard lithography to form the integrated structure. Thus, chip density does not decrease due to chip space that must be reserved for overlay alignment errors as shown in FIG. 1D.

The opening 214 is then filled with a conductive material, typically a metal, to form the integrated structure 216 shown in the simplified-perspective view of FIG. 2N. Possible metals are tungsten, aluminum, titanium, copper, silver, gold and their respective alloys. For simplicity, the metallization of opening 215 is not shown. The metallization step illustrated in FIG. 2N may utilize CVD metallization, sputter deposition or a metal reflow process. After the metallization step, a planarization step, such as chemical-mechanical polish (CMP), is used to remove any overflow (or excess) metal. Other metallization techniques may also be utilized. The self-aligned integrated structure 216 that is formed comprises two vias/contacts and an interconnect.

A second integrated structure may be formed by metallization of opening 215, which is not shown. On the other hand, the second integrated structure may not exist because of an earlier masking step of one of spacers 211 as shown in FIGS. 3A–F. Thus, the present inventive method is capable of forming an integrated self-aligned via/contact and interconnect with a critical dimension of sub-0.1 micron to 0.1 micron width without relying on the current lithography tool set or cost-prohibitive systems, such as E-beam or X-ray. The present method achieves the self-alignment using a single etch step so that no chip space is lost to overlay alignment errors. Thus, the inventive method achieves optimal chip density.

An alternate embodiment in which one of the spacers 211 is removed is illustrated in FIGS. 3A–F. As a result, that spacer 211 and the portions of spacer 205 below it 211 are not subsequently etched to form a damascene structure or opening as shown in FIGS. 2M-1-3. Since no damascene structure (opening) is formed, there is no metallization of the opening to form an integrated structure. Moreover, since that spacer 211 is removed, it does not crossover a spacer 205 and no via/contact is formed.

Figures 1, 3A:
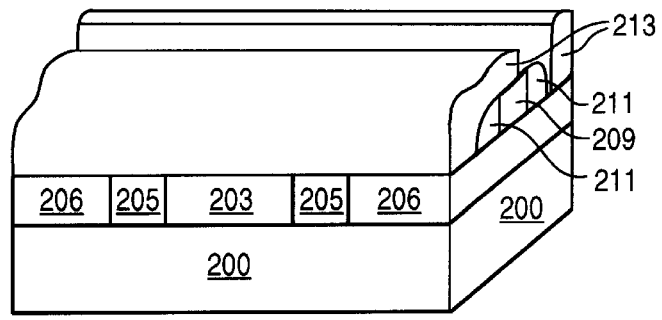
Figures 2, 3A:
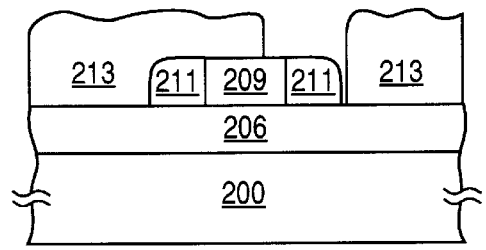

FIG. 3A-1 illustrates a front-perspective view of FIG. 2J, with the addition of a photoresist mask 213 over one of the spacers 211, second structure 209 and part of first sandwich structure. Mask 213 is not aligned over one of the spacers 211, which is to be removed, so that a crossover does not occur between it and a spacer 205 disposed below it. One of the spacers 211 may be removed because formation of a metal line or via/contact is not desired even though a crossover between that spacer 211 and spacer 205 has resulted. A side view of FIG. 3A-1 is illustrated in FIG. 3A-2. Mask 213 has an opening that is larger than the spacer 211 that will be etched in FIG. 3B. In other words, the opening in mask 213 must be large enough to allow all of spacer 211 to be exposed and then selectively etched. A selective etch of that spacer 211 may be obtained because of the materials chosen for first structure 209 and third layer 206.

Figure 3B:
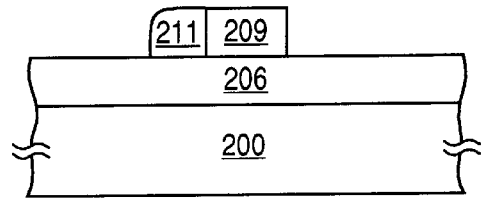
FIG. 3B is a side view after removing one of the second set of spacers, which was not masked.
Figure 3C:
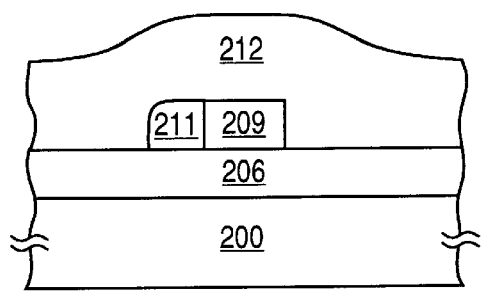
FIG. 3C is a side view after a conformal deposition of a sixth layer.

Next, as shown in FIG. 3B, the spacer 211 that was not covered by mask 213 is removed. In one embodiment, the spacer 211 was etched using standard dry etch techniques. The spacer 211 that was etched at this point will not become a metal line. In FIG. 3C, a sixth layer 212 is formed over the remaining spacer 211, second structure 209 and the exposed regions of first sandwich structure, which comprise first structure 203, spacers 205 and third layer 206. Sixth layer 212 can be conformally deposited using standard CVD techniques or any other applicable method. In one embodiment, sixth layer 212 is made of the same material as second structure 209, which is preferably silicon dioxide. Sixth layer 212 and second structure 209 are also preferably made of a material that will allow a selective etch of remaining spacer 211.

Figures 1, 3D:
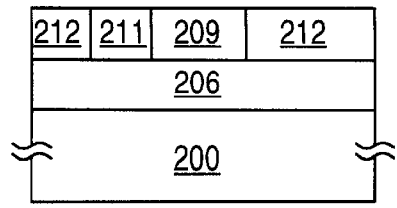
Figures 2, 3D:
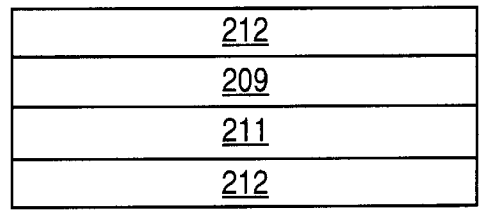

A side view, after sixth layer 212 has been planarized, is illustrated in FIG. 3D-1 and its corresponding top view is shown in FIG. 3D-2. The top surfaces of remaining spacer 211 and second structure 209 are exposed and are level with the top surface of sixth layer 212. The sixth layer 212 can be chemical-mechanically polished or planarized using other applicable techniques. A third sandwich structure is formed that is different from the second sandwich structure of FIG. 2L. The third sandwich structure comprises remaining spacer 211 surrounded on one side by sixth layer 212 and on the other side by second structure 209, which is then surrounded on its opposing side by another slice of sixth layer 212. A portion of sixth layer 212 replaces the etched spacer 211. As a result, a self-aligned metal line and via/contact cannot be formed at that location.

Figures 1, 3E:
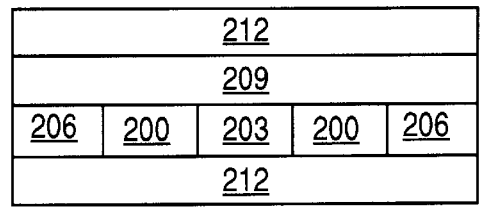
Figures 2, 3E:
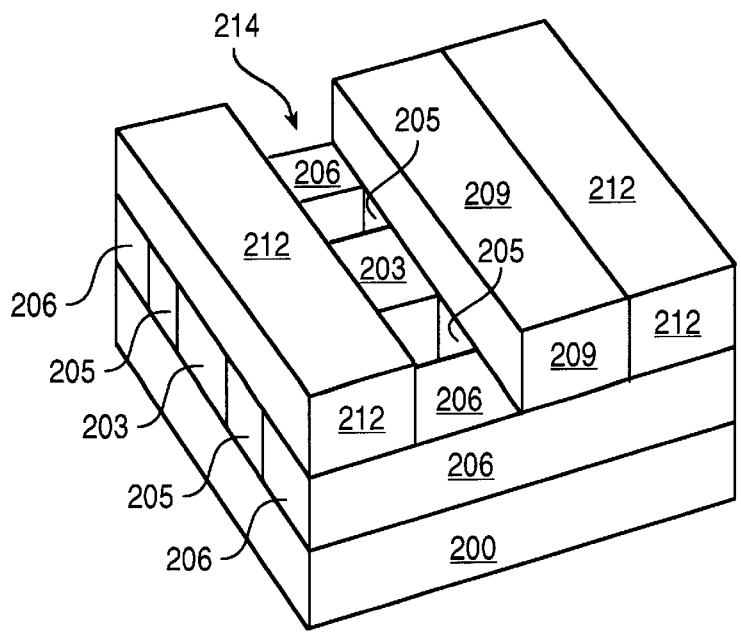

As illustrated in FIG. 3E-1, the next step is to selectively remove remaining spacer 211 and the portions of spacer 205 that are directly below the two points of contact (crossover) between spacer 211 and spacer 205. Thus, two via/contact holes are visible as two exposed squares of substrate 200 are now visible in the top view of FIG. 3E-1. A top surface of first structure 202 and third layer 206, which are all part of first sandwich structure, are also exposed. In a preferred embodiment, remaining spacer 211 and spacer 205 are made of silicon nitride and the various layers surrounding them are made of silicon dioxide. Moreover, the selective-anisotropic dry etch of spacers (205, 211) can be obtained using 40 sccm of fluoromethyl gas and 80 sccm of oxygen gas. As shown in the perspective view of FIG. 3E-2, a "balance-beam shaped" opening 214 (or damascene structure) results from the selective anisotropic etch of spacer 211 and part of spacer 205. The opening comprises two via/contact openings and a metal line structure. Unlike FIG. 2M-3, a second opening 215 was not created since one of spacers 211 was masked and removed earlier as shown in FIGS. 3A–B.

Figure 3F:
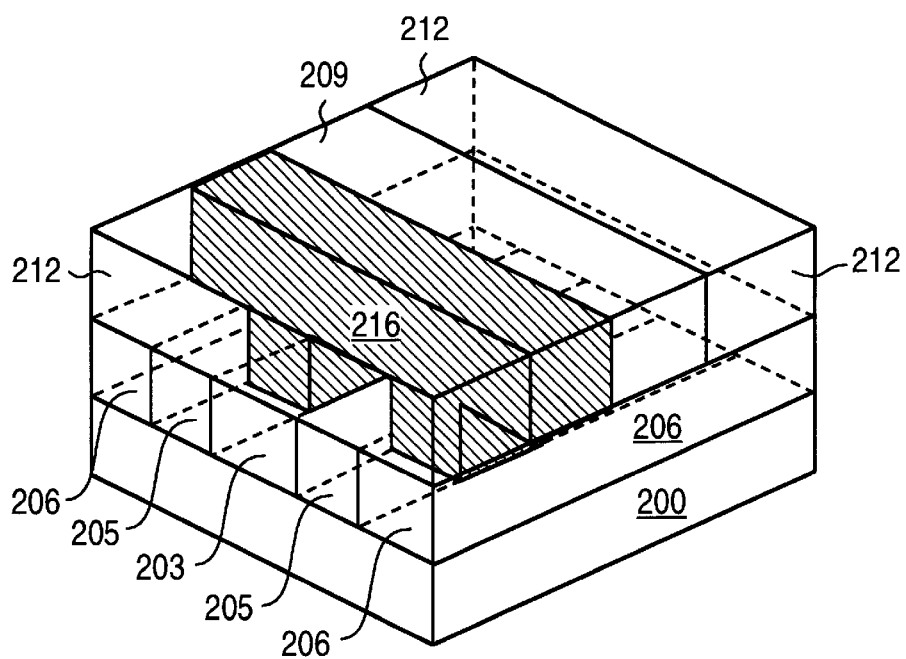
FIG. 3F is a side-perspective view after the opening is filled with a conductive layer to form the integrated structure.

Finally, a conductive layer is formed in the damascene structure (opening 214) to form the self-aligned integrated structure 216 illustrated in the perspective view of FIG. 3F. The conductive layer is usually a metal, such as tungsten, aluminum, titanium, copper, silver, gold and their respective alloys. The conductive layer may be formed during a metallization step using CVD metallization, sputter deposition, a metal reflow process or any other applicable method. After metallization, a planarization step, such as CMP, is used to remove any overflow or excess metal. Integrated structure 216 comprises two vias/contacts and an interconnect (metal line). Thus, this alternate embodiment is similar to the embodiment shown in FIGS. 2A–N with the exception that one of the spacers 211 was masked before formation of sixth layer 212. Consequently, only one opening 214 and one integrated structure 216 are formed. Both embodiments, however, are capable of forming self-aligned integrated structures that have vias/contacts and interconnects with sub-lithographic widths. In addition, both embodiments achieve self-alignment in a single selective etch step so that chip density does not decrease because of overlay alignment errors. Thus, both embodiments are capable of obtaining optimal chip density.

Although the present invention has shown active and passive devices at and within substrate 200 with a contact 102 formed in an insulating layer 103 disposed above substrate 200, it is equally applicable to forming via connections at higher levels of metallization. For example, the inventive method may be used to form an interconnect between a Metal 3 layer and a Metal 2 layer.

In the above description, numerous specific details were given to be illustrative and not limiting of the present invention. It will be evident to one skilled in the art that the invention may be practiced without these specific details. Moreover, in some instances, well-known semiconductor equipment and processes have not been set forth in detail in order to not unnecessarily obscure the present invention. Thus, the method of the present invention is defined by the appended claims.

I claim:

1. A method of forming an integrated structure comprising the steps of:
   forming a first sandwich structure having a first spacer of a first dielectric that is surrounded by a first insulating layer;
   forming a second sandwich structure having a second spacer of the first dielectric that is surrounded by a second insulating layer, wherein said second sandwich structure is disposed above said first sandwich structure;
   removing said second spacer and a portion of said first spacer that is disposed below said second spacer to form a first opening; and
   forming a conductive layer in the first opening to create a first integrated structure.

2. The method of claim 1, wherein the integrated structure comprises a self-aligned via/contact formed from the portion of said first spacer and an interconnect formed from said second spacer.

3. The method of claim 1, wherein said first dielectric and said first and second insulating layers allow selective etching of said first dielectric.

4. The method of claim 1, wherein said first dielectric is silicon nitride and said first and said second insulating layers are silicon dioxide.

5. The method of claim 1, wherein said first dielectric is silicon dioxide and said first and said second insulating layers are silicon nitride.

6. The method of claim 3, wherein said first insulating layer comprises a different material than said second insulating layer.

7. The method of claim 1, wherein said conductive layer is selected from a group consisting of tungsten, aluminum, titanium, copper, silver, gold and their respective alloys.

8. The method of claim 1, wherein a first angle exists between said first spacer and said second spacer at point of contact, which is the point at which part of a lower surface of said second spacer touches a top surface of said first spacer.

9. The method of claim 8, wherein said second sandwich structure further includes a third spacer of the first dielectric, wherein said third spacer is also surrounded by said second insulating layer.

10. The method of claim 9, further includes the step of:
    removing a portion of said third spacer to form part of the first opening, and wherein a second angle exists between said third spacer and said first spacer at point of contact.

11. The method of claim 10, wherein said first angle and said second angle are each between an angle less than 90 degrees and 90 degrees.

12. The method of claim 9, further includes the steps of:
    removing a portion of said third spacer to form a second opening; and
    forming a conductive layer in the second opening to create a second integrated structure.

13. The method of claim 9, further includes the step of:
    forming a third layer over said third spacer so that said third spacer is not removed during removal of said second spacer and the portion of said first spacer.

14. A method of forming an integrated structure having a via/contact and interconnect, the method comprising the steps of:
    forming a first portion of a first dielectric layer on a substrate;
    forming a first material on said substrate and over said first portion of said first layer;
    anisotropically etching said first material to form a spacer adjacent to said first portion of said first layer;
    forming a second portion of said first dielectric layer adjacent to said first spacer;
    forming a second spacer of the first material in a second layer, wherein said second spacer is disposed above said first spacer and an angle exists at the point of contact between said first spacer and said second spacer;
    removing said first and second spacers to create an opening; and
    forming a conductive layer in the opening to create the integrated structure.

15. The method of claim 14, wherein the integrated structure includes a via/contact and a metal line with a width that ranges from sub-0.1 micron to 1 micron.

16. The method of claim 14, wherein said first material, said first and said second layers are materials that allow a selective etch of said first dielectric.

17. The method of claim 14, wherein the angle is between an angle less than 90° and 90°.

18. A method of forming an integrated structure comprising the steps of:
    forming a first layer of a first insulator on a substrate;
    patterning said first layer to form a first structure having a plurality of opposing edges;
    forming a second layer of a second insulator over said first structure;
    etching said second layer to form a first spacer, wherein part of said first spacer touches a first opposing edge of said first structure;
    forming a third layer over said first structure and said first spacer;
    removing part of said third layer to expose a part of said first spacer and a part of said first structure;
    forming a fourth layer over said first structure, said first spacer and said third layer;
    patterning said fourth layer to form a second structure having a plurality of opposing edges;
    forming a fifth layer of the second insulator over said second structure;

etching said fifth layer to form a second spacer, wherein part of said second spacer touches a first opposing edge of said second structure and a lower surface of said second spacer crosses over a top surface of said first spacer at a point of contact;

forming a sixth layer over said second structure and said second spacer;

removing part of said sixth layer to expose part of said second spacer and part of said second structure;

removing part of said first spacer and said second spacer to create a first damascene structure; and forming a conductive layer in the first damascene structure to form the first integrated structure.

19. The method of claim 18, wherein said step of removing part of said first spacer and said second spacer includes an anisotropic etch.

20. The method of claim 18, wherein the removed part of said first spacer forms a via/contact hole and the removed part of said second spacer forms a metal line structure, and wherein the thickness of said second layer is approximately the desired width of the via/contact.

21. The method of claim 18, wherein said third, fourth and sixth layers are each formed of the first insulator.

22. The method of claim 18, wherein said third, fourth and sixth layers are each formed of materials that allow a selective etch of the second insulator.

23. The method of claim 18, wherein said first and said second insulators are two different dielectrics that allow a selective etch of the second insulator.

24. The method of claim 21, wherein said first and said second insulators are two different dielectrics that allow a selective etch of the second insulator.

25. The method of claim 18, wherein said first insulator is silicon dioxide and said second insulator is silicon nitride.

26. The method of claim 21, wherein said first insulator is silicon dioxide and said second insulator is silicon nitride.

27. The method of claim 21, wherein said first insulator is silicon nitride and said second insulator is silicon dioxide.

28. The method of claim 18, wherein said conductive layer is a metal selected from a group consisting of tungsten, aluminum, titanium, silver, gold, copper and their respective alloys.

29. The method of claim 18, wherein a first angle exists between said first spacer and said second spacer at point of contact.

30. The method of claim 18, wherein the step of patterning said first layer uses a mask.

31. The method of claim 18, wherein the step of patterning said fourth layer uses a mask.

32. The method of claim 23, further includes the step of:

etching said second layer to form a third spacer, wherein part of said third spacer touches a second opposing edge of said first structure.

33. The method of claim 32, further includes the step of:

removing a portion of said third spacer that is disposed below said second spacer to form part of the first damascene structure, and wherein a second angle exists between said second spacer and said third spacer at point of contact.

34. The method of claim 23, further includes the step of:

etching said fifth insulating layer to form a fourth spacer, wherein part of said fourth spacer touches a second opposing edge of said second structure.

35. The method of claim 34, further includes the step of:

removing said fourth spacer to form part of the first damascene structure, and wherein a third angle exists between said first spacer and said fourth spacer at point of contact.

36. The method of claim 34, further includes the step of:

forming a seventh layer over said fourth spacer so that said fourth spacer does not touch a fifth spacer and is not coupled to said fifth spacer, wherein said fifth spacer is disposed above said fourth spacer.

37. The method of claim 32, further comprising the step of:

etching said fifth insulating layer to form a fourth spacer, wherein part of said fourth spacer touches a second opposing edge of said second structure.

38. The method of claim 37, further comprising the step of:

removing said fourth spacer to form part of the first damascene structure.

39. The method of claim 37, further includes the step of:

forming a seventh layer over said fourth spacer so that fourth spacer is not removed and does not form part of first damascene structure.

40. The method of claim 37, further comprising the step of:

removing said fourth spacer to form a second damascene structure.

* * * * *